United States Patent
Bennett et al.

(10) Patent No.: US 10,575,393 B1
(45) Date of Patent: Feb. 25, 2020

(54) HEAT-SHIELDING MICROCAPSULES FOR PROTECTING TEMPERATURE SENSITIVE COMPONENTS

(71) Applicant: International Business Machines Corporation, Armonk, NY (US)

(72) Inventors: Jennifer I. Bennett, Rochester, MN (US); Eric J. Campbell, Rochester, MN (US); Sarah K. Czaplewski-Campbell, Rochester, MN (US); Elin F. Labreck, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/189,629

(22) Filed: Nov. 13, 2018

(51) Int. Cl.
*B23K 31/02* (2006.01)
*H05K 1/02* (2006.01)
(Continued)

(52) U.S. Cl.
CPC ......... *H05K 1/0209* (2013.01); *B23K 1/0016* (2013.01); *H05K 1/181* (2013.01);
(Continued)

(58) Field of Classification Search
CPC ...... H05K 1/0209; H05K 1/181; H05K 3/303; H05K 2201/10371; B23K 1/00–206; B23K 2101/36–42
(Continued)

(56) References Cited

U.S. PATENT DOCUMENTS

| 4,093,771 A | 6/1978 | Goldstein et al. |
| 4,152,477 A * | 5/1979 | Haruta ................... H05K 3/387 |
| | | 174/259 |

(Continued)

FOREIGN PATENT DOCUMENTS

| DE | 3425724 A1 * | 1/1986 | ............. H01L 24/27 |
| EP | 2816904 A2 | 12/2014 | |

(Continued)

OTHER PUBLICATIONS

Boh et al., *Microencapsulation of higher hydrocarbon phase change materials by in situ polymerization*, Journal of Microencapsulation, vol. 22, Issue 7, Nov. 2005, pp. 715-735, Taylor & Francis Group, UK.

(Continued)

*Primary Examiner* — Kiley S Stoner
(74) *Attorney, Agent, or Firm* — James L. Olsen

(57) ABSTRACT

A process of utilizing heat-shielding microcapsules to protect a temperature sensitive component includes applying a shielding layer including heat-shielding microcapsules to a temperature sensitive component disposed on a surface of a printed circuit board. The process also includes performing a processing operation on the printed circuit board according to a set of process parameters. The set of process parameters specify a particular period of time ($t_L$) that a processing temperature ($T_P$) is to be maintained in excess of a liquidous temperature ($T_L$) for solder reflow. During the processing operation, the heat-shielding microcapsules absorb heat to reduce a time above liquidous (TAL) of the temperature sensitive component.

18 Claims, 7 Drawing Sheets

(51) Int. Cl.
  *H05K 1/18* (2006.01)
  *H05K 3/30* (2006.01)
  *B23K 1/00* (2006.01)
  *B23K 101/42* (2006.01)

(52) U.S. Cl.
  CPC .......... *H05K 3/303* (2013.01); *B23K 2101/42* (2018.08); *H05K 2201/10371* (2013.01)

(58) Field of Classification Search
  USPC .......................... 228/179.1–180.22, 245–262
  See application file for complete search history.

(56) References Cited

U.S. PATENT DOCUMENTS

| | | | | | |
|---|---|---|---|---|---|
| 4,327,369 | A | * | 4/1982 | Kaplan | H01G 2/12 174/521 |
| 5,007,478 | A | * | 4/1991 | Sengupta | F28D 20/023 165/10 |
| 6,181,558 | B1 | | 1/2001 | Gordon | |
| 6,317,321 | B1 | * | 11/2001 | Fitch | F28D 20/02 165/104.33 |
| 8,587,945 | B1 | * | 11/2013 | Hartmann | H05K 7/20454 361/679.53 |
| 2002/0011665 | A1 | * | 1/2002 | Tatsumi | H01L 25/065 257/736 |
| 2003/0138632 | A1 | * | 7/2003 | Huang | B01J 13/02 428/407 |
| 2003/0164541 | A1 | * | 9/2003 | Lee | H01L 21/563 257/686 |
| 2004/0159422 | A1 | * | 8/2004 | Zuo | F28D 15/046 165/104.14 |
| 2004/0234763 | A1 | * | 11/2004 | Saito | C08G 59/18 428/402.2 |
| 2005/0233567 | A1 | * | 10/2005 | Kim | H01L 23/49816 438/612 |
| 2010/0285313 | A1 | | 11/2010 | Zhang et al. | |
| 2013/0012634 | A1 | * | 1/2013 | Gauthy | C08K 9/02 524/263 |
| 2013/0034739 | A1 | * | 2/2013 | Boday | B01J 13/18 428/447 |
| 2013/0299981 | A1 | * | 11/2013 | Maohua | H01L 23/26 257/738 |
| 2014/0002998 | A1 | * | 1/2014 | Pidwerbecki | H05K 7/2039 361/717 |
| 2014/0285967 | A1 | * | 9/2014 | Wikander | G06F 1/1656 361/679.54 |
| 2014/0367607 | A1 | * | 12/2014 | Weng | B29C 45/0001 252/77 |
| 2015/0249022 | A1 | * | 9/2015 | Brunschwiler | H01L 21/563 438/127 |
| 2015/0265662 | A1 | | 9/2015 | Penhasi | |
| 2016/0053069 | A1 | * | 2/2016 | Gotoh | B32B 5/18 428/313.5 |
| 2016/0104659 | A1 | * | 4/2016 | Park | H01L 23/49838 257/774 |
| 2016/0223269 | A1 | * | 8/2016 | Hartmann | H01L 23/4275 |
| 2017/0053847 | A1 | * | 2/2017 | Takematsu | H01L 23/295 |
| 2017/0130993 | A1 | * | 5/2017 | Campbell | H01L 23/4275 |
| 2017/0200659 | A1 | * | 7/2017 | Gaynes | H01L 23/3185 |
| 2018/0063949 | A1 | * | 3/2018 | Campbell | B29C 35/0272 |
| 2018/0124945 | A1 | * | 5/2018 | Quenard | H04N 5/33 |
| 2018/0126497 | A1 | * | 5/2018 | Campbell | B23K 35/3615 |
| 2018/0307122 | A1 | * | 10/2018 | Sugiyama | G03B 17/02 |
| 2018/0340032 | A1 | * | 11/2018 | Campbell | C08F 2/48 |
| 2019/0118312 | A1 | * | 4/2019 | Bennett | B23K 35/362 |
| 2019/0291357 | A1 | * | 9/2019 | Campbell | F16B 11/006 |

FOREIGN PATENT DOCUMENTS

| | | | |
|---|---|---|---|
| JP | 5556613 B2 | * | 7/2014 |
| WO | WO-2009/029758 A1 | | 3/2009 |
| WO | WO-2013/069021 A2 | | 5/2013 |
| WO | WO-2014/024971 A1 | | 2/2014 |
| WO | WO-2015/026353 A1 | | 2/2015 |
| WO | WO-2018135140 A1 | * | 7/2018 ................ C08J 9/14 |

OTHER PUBLICATIONS

Wikipedia, *Barium Hydroxide*, accessed Jun. 22, 2018, 7 pages, URL: en.wikipedia.org/wiki/Barium_hydroxide.

Google Search, *Ammonium Thiocyanate*, performed Jun. 22, 2018, 1 page, URL: www.google.com/search?q=Ammonium+Thiocyanate &ie=utf-8&oe=utf-8.

Wikipedia, *Conformal Coating*, accessed Jun. 22, 2018, 11 pages, URL: en.wikipedia.org/wiki/Conformal_coating.

Brandrup et al., *Melting Point of Polymers*, Polymer Handbook, Fourth Edition, Contents: VI. Solid State Properties, VI/1. Crystallographic Data and Melting Points for Various Polymers, References p. VI-159, pp. VI/71-93, John Wiley & Sons, Inc., New York.

\* cited by examiner

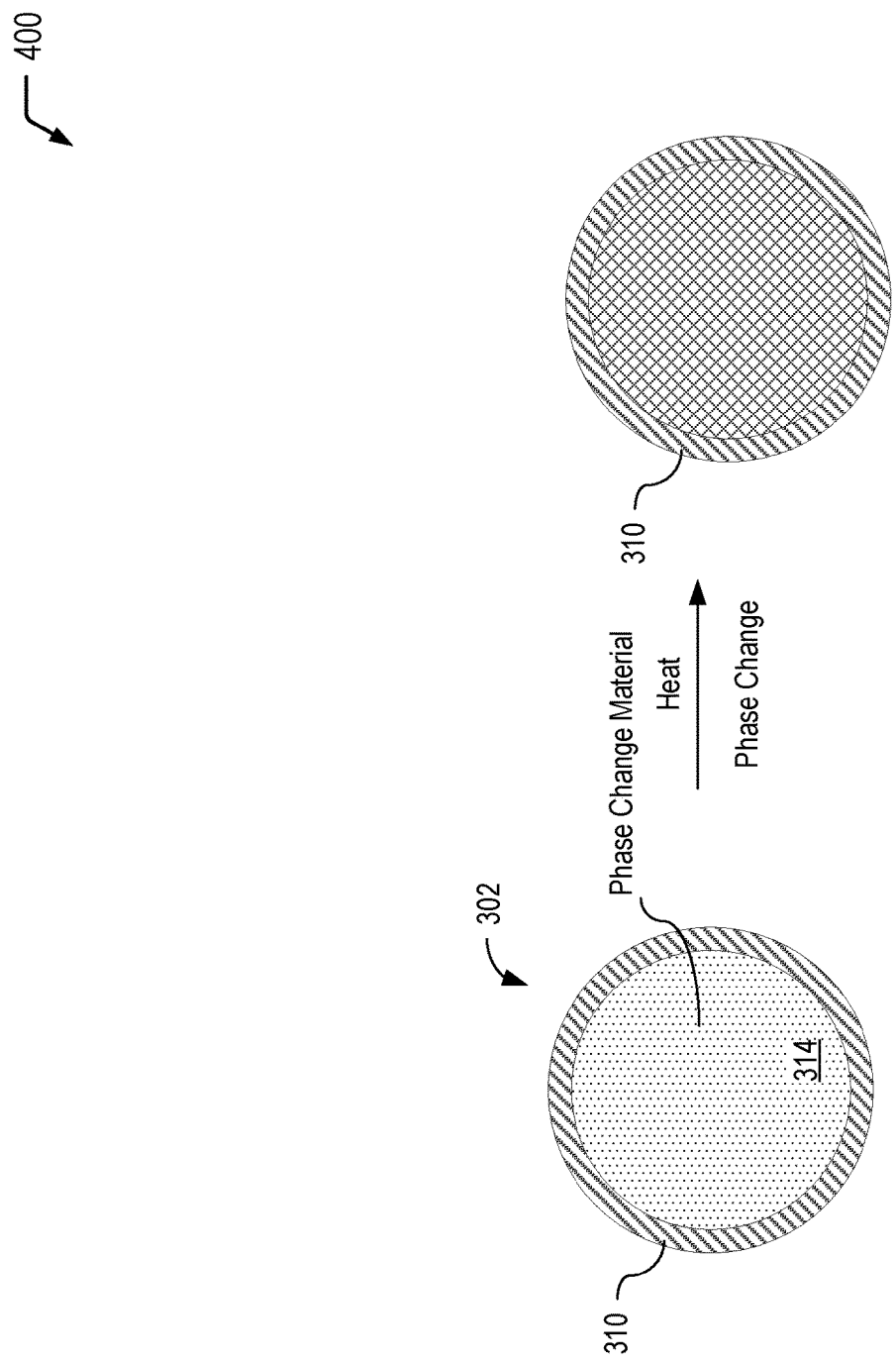

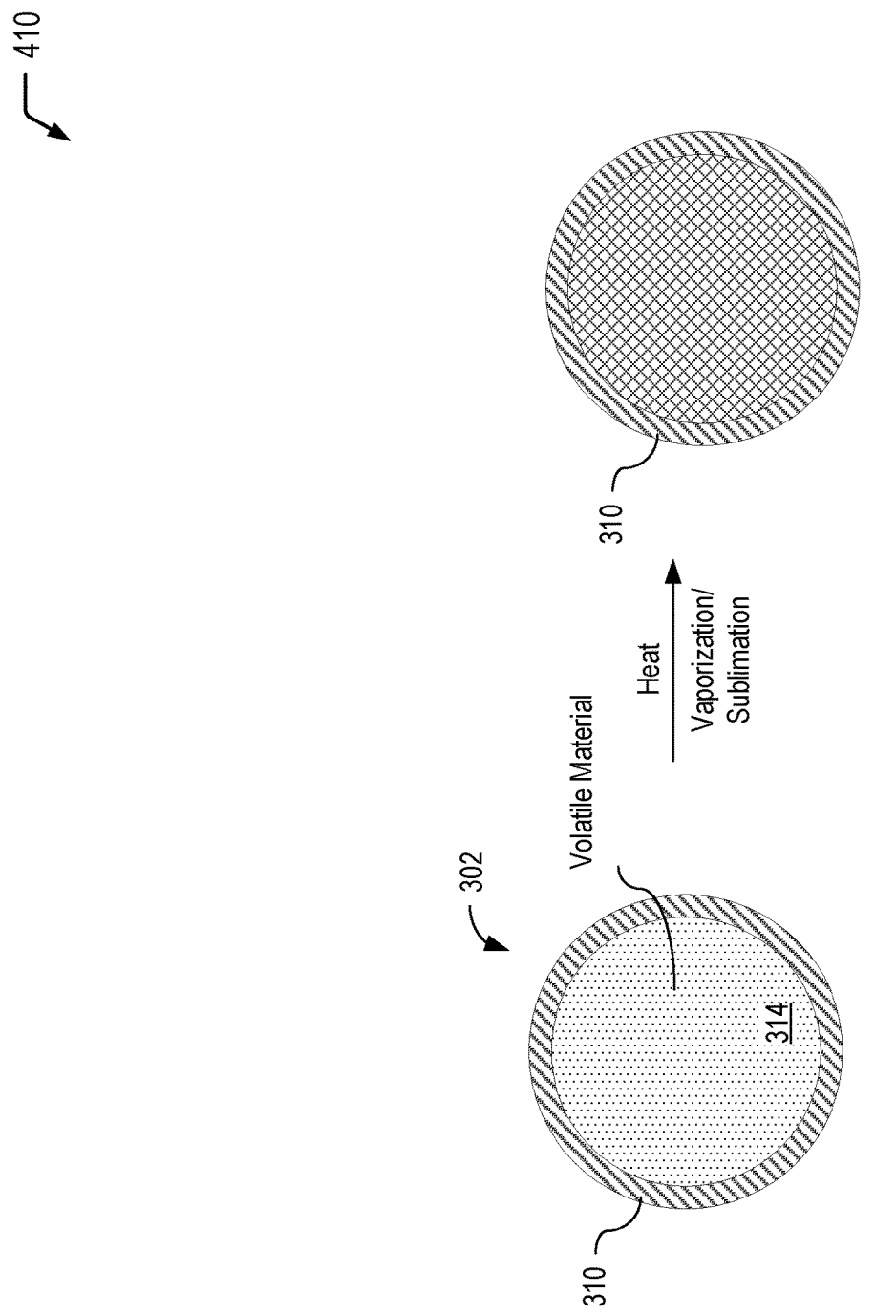

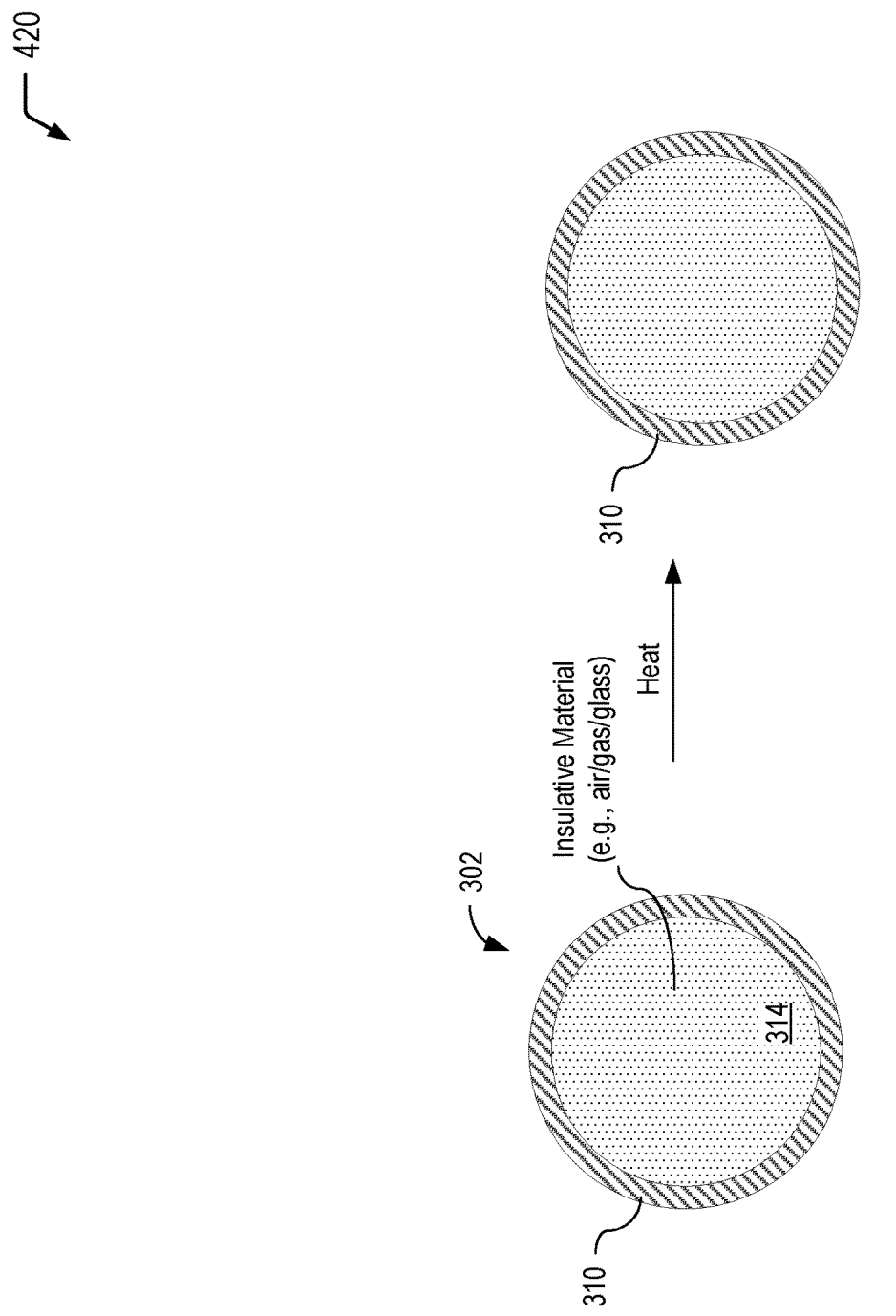

HEAT-SHIELDING MICROCAPSULES FOR PROTECTING TEMPERATURE SENSITIVE COMPONENTS

BACKGROUND

Printed circuit boards contain temperature sensitive components, which are components that have significant time and temperature limitations. Examples of temperature sensitive components include aluminum and polymer-aluminum capacitors, film capacitors, molded tantalum capacitors, fuses, inductors and transformers with wire coils, light emitting diodes, etc. Extended time above liquidous (TAL) temperature is of primary concern as well as significant time and temperature limitations for temperature sensitive components (TSCs) between 230° C. to 250° C. This poses an issue when processing printed circuit boards, as temperature sensitive components are very sensitive to preheat time and temperature, TAL, peak reflow temperature, time within 5° C. of peak temperature, number of reflow passes, flux exposure, and cleaning processes. Exposures during processing can lead to latent defects that are not be detected in final testing, resulting in a field failure of the temperature sensitive component.

SUMMARY

According to an embodiment, a process of utilizing heat-shielding microcapsules to protect a temperature sensitive component is disclosed. The process includes applying a shielding layer including heat-shielding microcapsules to a temperature sensitive component disposed on a surface of a printed circuit board. The heat-shielding microcapsules include shell-in-shell microcapsules having an inner shell and an outer shell to isolate reactants that undergo an endothermic chemical reaction. The process also includes performing a processing operation on the printed circuit board according to a set of process parameters. The set of process parameters specify a particular period of time ($t_L$) that a processing temperature ($T_P$) is to be maintained in excess of a liquidous temperature ($T_L$) for solder reflow. During the processing operation, the heat-shielding microcapsules absorb heat to reduce a time above liquidous (TAL) of the temperature sensitive component.

According to another embodiment, a process of utilizing heat-shielding microcapsules to protect a temperature sensitive component is disclosed. The process includes applying a shielding layer including heat-shielding microcapsules to a temperature sensitive component disposed on a surface of a printed circuit board. The heat-shielding microcapsules encapsulate a heat-absorbing material. The process also includes performing a processing operation on the printed circuit board according to a set of process parameters. The set of process parameters specify a particular period of time ($t_L$) that a processing temperature ($T_P$) is to be maintained in excess of a liquidous temperature ($T_L$) for solder reflow. During the processing operation, the heat-shielding microcapsules absorb heat to reduce a time above liquidous (TAL) of the temperature sensitive component.

According to yet another embodiment, a heat-shielding shell-in-shell microcapsule for protection of a temperature sensitive component during processing of a printed circuit board is disclosed. The heat-shielding microcapsule has an inner shell encapsulating a first set of reactants and an outer shell encapsulating a second set of reactants. The inner shell is formed from a first polymeric material, and the outer shell is formed from a second polymeric material. The first polymeric material has a first melt temperature or a first decomposition temperature that is less than a liquidous temperature ($T_L$) for solder reflow. The second polymeric material has a second melt temperature or a second decomposition temperature that is greater than a processing temperature ($T_P$) to be maintained in excess of the liquidous temperature ($T_L$) for a particular period of time ($t_L$) during a processing operation on a printed circuit board. The processing operation results in rupture of the inner shell, causing an endothermic reaction between the first set of reactants and the second set of reactants. The endothermic reaction absorbs heat to reduce a time above liquidous (TAL) of a temperature sensitive component disposed on a surface of the printed circuit board.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIGS. 4A to 4C are cross-sectional views of a single-compartment microcapsule corresponding to one of the heat-shielding microcapsules depicted in FIG. 3, in which a heat-absorbing material is encapsulated within the microcapsule, according to various embodiments.

DETAILED DESCRIPTION

The present disclosure describes utilizing heat-shielding microcapsules to protect temperature sensitive components (TSCs) during printed circuit board (PCB) processing. The heat-shielding microcapsules of the present disclosure provide various mechanisms to absorb heat during PCB processing in which a processing temperature ($T_P$) is maintained in excess of a liquidous temperature ($T_L$) for solder reflow for a particular period of time ($t_L$). Absorption of heat in an area on and/or around the TSCs may reduce a time above liquidous (TAL) for the TSCs, potentially mitigating latent defect risk and processing limitations for the TSCs.

In some embodiments, the heat-shielding microcapsules of the present disclosure may include multiple compartments to isolate a first reactant (or a first set of reactants) from a second reactant (or a second set of reactants) within the same heat-shielding microcapsule. Exposure of the heat-shielding microcapsule to a threshold temperature results in rupture of an inner compartment, enabling the first reactant(s) and the second reactant(s) to mix and undergo an endothermic chemical reaction within the heat-shielding microcapsule. In other embodiments, the heat-shielding microcapsules of the present disclosure may encapsulate a phase change material (e.g., a tin alloy), a material that vaporizes/sublimates (e.g., ethylene/propylene glycol), or an insulating material (e.g., glass/air/gas).

As used herein, the term "microcapsule" is used to refer to capsules that are in a range of about 10 microns to 1000 microns in diameter. However, it will be appreciated that the following disclosure may be applied to capsules having a smaller size (also referred to as "nanocapsules").

Figure 1:
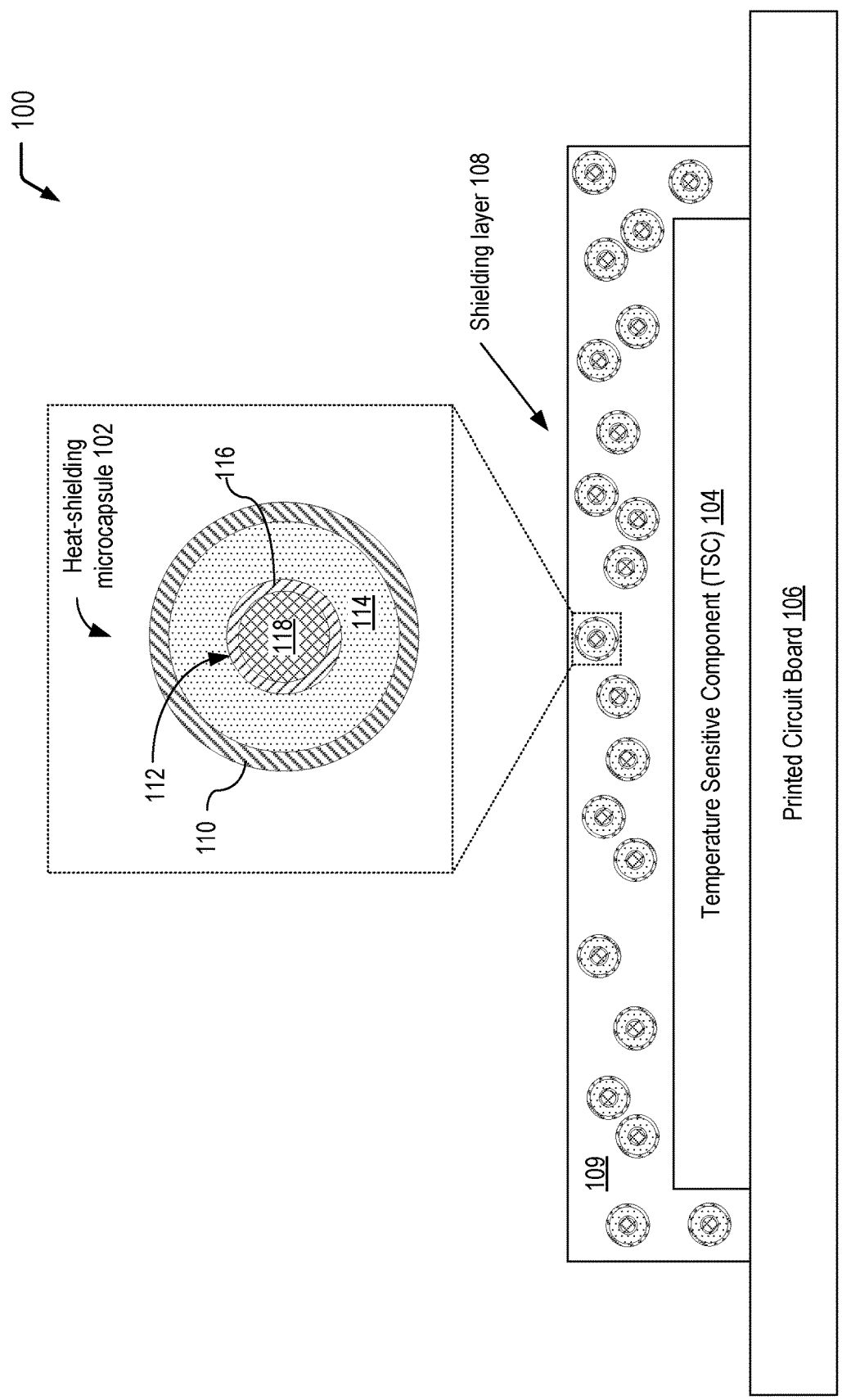
FIG. 1 is a diagram depicting a process of utilizing heat-shielding microcapsules to protect a temperature sensitive component disposed on a surface of a printed circuit board, according to one embodiment.

FIG. 1 is a diagram 100 depicting a process of utilizing heat-shielding microcapsules 102 to protect a temperature sensitive component (TSC) 104 disposed on a surface of a printed circuit board 106. The bottom portion of FIG. 1 is a cross-sectional view illustrating a shielding layer 108 including the heat-shielding microcapsules 102 dispersed in a matrix material 109, after application of the shielding layer 108 to an area on and/or around the TSC 104. In the case of a conformal coating, the matrix material 109 may be a parylene material, an acrylic material, or a urethane material, among other alternatives. In the case of an adhesive tape, the matrix material 109 may be a polyimide material, such as Kapton, among other alternatives. The top portion of FIG. 1 is an exploded cross-sectional view of one of the heat-shielding microcapsules 102 dispersed within the shielding layer 108.

The heat-shielding microcapsules 102 illustrated in FIG. 1 include multiple compartments and are also referred to herein as multiple-compartment microcapsules. As described further herein with respect to FIG. 2, the compartments of the heat-shielding microcapsules 102 enable isolation of reactants that undergo an endothermic chemical reaction when mixed. In the particular embodiment depicted in FIG. 1, the heat-shielding microcapsules 102 dispersed in the matrix material 109 of the shielding layer 108 have a shell-in-shell architecture. It will be appreciated that, in alternative embodiments, the heat-shielding microcapsules 102 may have an alternative multiple-compartment microcapsule design, may include more than one type of multiple-compartment microcapsule design, or a combination thereof.

The exploded cross-sectional view depicted at the top of FIG. 1 illustrates that each of the heat-shielding microcapsules 102 has an outer wall 110 (also referred to herein as the "outer shell") and contains an inner microcapsule 112 and a first reactant 114 (or a first set of multiple reactants). The inner microcapsule 112 has a capsule wall 116 (also referred to herein as the "inner shell") and contains a second reactant 118 (or a second set of multiple reactants). The first reactant(s) 114 within the heat-shielding microcapsule 102 may surround the inner microcapsule 112, and the first reactant(s) 114 may be prevented from contacting the second reactant(s) 118 by the capsule wall 116 of the inner microcapsule 112. In a particular embodiment, the capsule wall 116 of the inner microcapsule 112 may be designed to rupture when exposed to a particular temperature during high-temperature processing of the PCB 106, and the outer wall 110 of the heat-shielding microcapsule 102 may be formed so as to not rupture when exposed to the particular temperature.

In FIG. 1, the heat-shielding microcapsules 102 are shown prior to performing a high-temperature processing operation on the PCB 106. The processing operation may be performed according to a set of process parameters specifying a particular period of time ($t_L$) that a processing temperature ($T_P$) is to be maintained in excess of a liquidous temperature ($T_L$) for solder reflow. The capsule wall 116 is tailored to break down, melt, or decompose at a threshold temperature that may pose a risk to the TSC 104. The threshold temperature may be less than the reflow temperature of solder and should be below the temperature threshold of the TSC 104. To illustrate, in the case of a Pb-free assembly, the threshold temperature may be near a liquidous temperature of 217° C.

Figure 2:
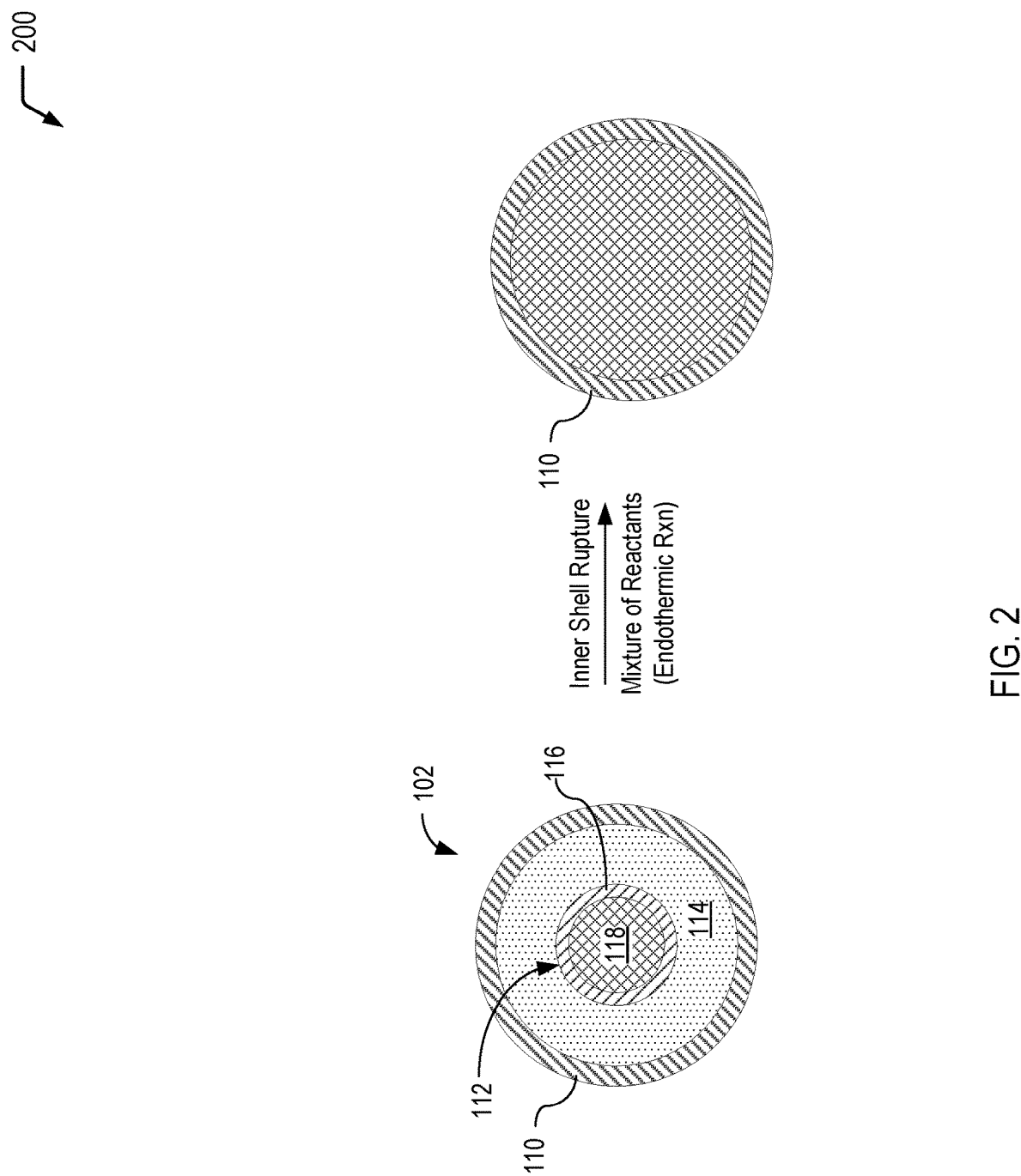
FIG. 2 is a cross-sectional view of a multiple-compartment microcapsule corresponding to one of the heat-shielding microcapsules depicted in FIG. 1, in which exposure to sufficient heat causes reactants that are isolated within individual compartments of the multiple-compartment microcapsule to mix and undergo an endothermic chemical reaction within the microcapsule, according to one embodiment.

During processing of the PCB 106, when a temperature near the TSC 104 reaches the threshold temperature, the capsule wall 116 ruptures, and the reactants mix, triggering an endothermic reaction (as depicted in FIG. 2). The endothermic reaction absorbs heat during the processing operation to reduce a time above liquidous (TAL) of the TSC 104, thereby mitigating latent defect risk and processing limitations.

Thus, FIG. 1 illustrates an example of a process of utilizing heat-shielding microcapsules to protect a temperature sensitive component during high-temperature printed circuit board processing. The multiple-compartment design of the heat-shielding microcapsules depicted in FIG. 1 provides a mechanism by which an endothermic reaction is utilized to absorb heat, thereby reduce a TAL for the temperature sensitive component. The reduction in the TAL may mitigate latent defect risk and processing limitations.

FIG. 2 illustrates an exploded cross-sectional view 200 of one of the heat-shielding microcapsules 102 disposed in the matrix material 109 of the shielding layer 108 depicted in FIG. 1. The left side of FIG. 2 illustrates one of the heat-shielding microcapsules 102 prior to performing a high-temperature processing operation, with the capsule wall 116 intact. The right side of FIG. 2 illustrates that exposure to a threshold temperature causes the capsule wall 116 to rupture. Rupture of the capsule wall 116 of the inner microcapsule 112 allows the first reactant(s) 114 and the second reactant(s) 118 to mix and undergo the endothermic chemical reaction.

The capsule wall 116 may be tailored to break down, melt, or decompose at a threshold temperature that may pose a risk to the TSC 104. The threshold temperature may be less than the reflow temperature of solder and should be below the temperature threshold of the TSC 104. To illustrate, in the case of a Pb-free assembly, the IPC J-STD-020D.1 standard specifies that temperature sensitive components, such as non-hermetic solid state surface mount devices, should not be above a liquidous temperature (e.g., 217° C.) for more than 60 to 150 seconds. In this example, the threshold temperature may be near a liquidous temperature of 217° C.

In a particular embodiment, the capsule wall 116 may be a polymeric material such as Poly(acrylonitrile) having a melt temperature ($T_m$) of 200° C., Poly(acrylonitrile)-alpha-propyl having a $T_m$ of 210° C., or Poly(aminoditrimethylene oxamide)-N-methyl having a $T_m$ of 202° C., among numerous other alternatives. The outer wall 110 may be a polymeric material that is capable of withstanding PCB processing temperatures. Illustrative, non-limiting examples of materials that may be suitable for the outer wall 110 include: a Poly(4-aminocyclohexyleneacetic acid); a Poly(1,4-cyclohexylene adipamide); a Poly(acrylonitrile); a syndiotactic polymer; or a polysulfone.

In a particular embodiment, the first reactant(s) 114 may correspond to ammonium nitrate, and the second reactant(s) 118 may correspond to water (or vice versa). This endothermic reaction has a standard enthalpy of 25.41 kJ/mol. In another embodiment, the first reactant(s) 114 may correspond to barium hydroxide, and the second reactant(s) 118 may correspond to ammonium thiocyanate (or vice versa). This endothermic reaction has a standard enthalpy of 102 kJ/mol. In yet another embodiment, the first reactant(s) 114 may correspond to thionyl chloride, and the second reactant(s) 118 may correspond to cobalt sulfate heptahydrate (or vice versa).

Thus, FIG. 2 illustrates an example of a multiple-compartment microcapsule design that provides a mechanism to enable an endothermic reaction within the microcapsule to provide heat shielding for a temperature sensitive component (e.g., the TSC 104 depicted in FIG. 1). The heat shielding capability may reduce a TAL for the temperature sensitive component, potentially mitigating latent defect risk and processing limitations.

Figure 3:
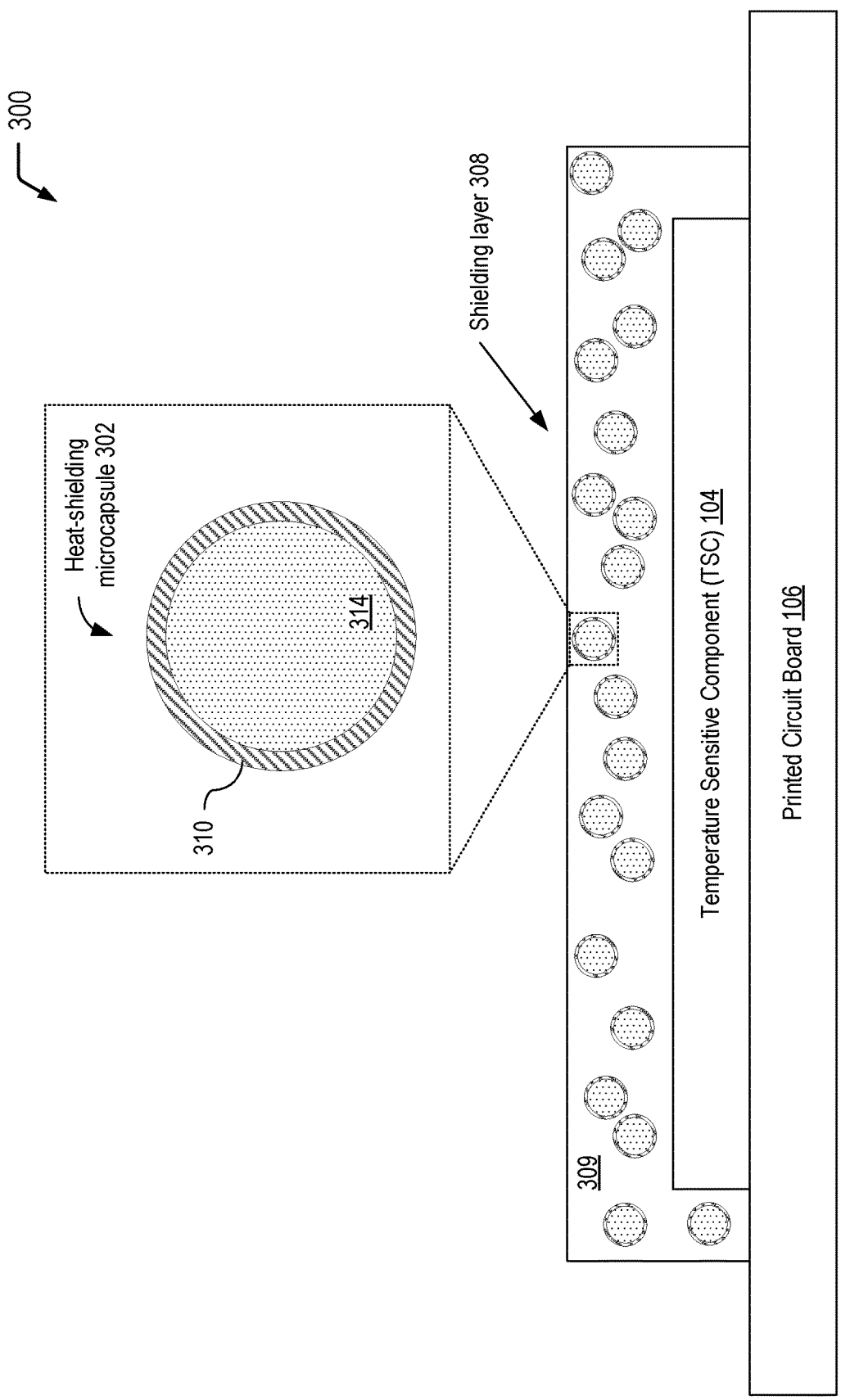
FIG. 3 is a diagram depicting a process of utilizing heat-shielding microcapsules to protect a temperature sensitive component disposed on a surface of a printed circuit board, according to one embodiment.

FIG. 3 is a diagram 300 depicting a process of utilizing heat-shielding microcapsules 302 having an alternative design to protect the TSC 104. The bottom portion of FIG. 3 is a cross-sectional view illustrating a shielding layer 308 including the heat-shielding microcapsules 302 dispersed in a matrix material 309, after application of the shielding layer 308 to an area on and/or around the TSC 104. The top portion of FIG. 3 is an exploded cross-sectional view of one of the heat-shielding microcapsules 302 dispersed within the matrix material of the shielding layer 308.

The exploded cross-sectional view depicted at the top of FIG. 3 illustrates that each of the heat-shielding microcapsules 302 has an outer wall 310 (also referred to herein as the "outer shell") that contains a heat-absorbing material 314 (or multiple heat-absorbing materials). In some cases, the heat-absorbing material 314 may correspond to a phase change material (see FIG. 4A). In other cases, the heat-absorbing material 314 may correspond to a volatile material (see FIG. 4B). Alternatively, the heat-absorbing material 314 may correspond to an insulative material (see FIG. 4C).

In FIG. 3, the heat-shielding microcapsules 302 are shown prior to performing a high-temperature processing operation on the PCB 106. The processing operation may be performed according to a set of process parameters specifying a particular period of time ($t_L$) that a processing temperature ($T_P$) is to be maintained in excess of a liquidous temperature ($T_L$) for solder reflow. The heat-absorbing material 314 may be selected to provide heat absorption functionality at a threshold temperature that may pose a risk to the TSC 104. The threshold temperature may be less than the reflow temperature of solder and should be below the temperature threshold of the TSC 104. To illustrate, in the case of a Pb-free assembly, the threshold temperature may be near a liquidous temperature of 217° C.

FIGS. 4A to 4C are diagrams 400, 410, 420 illustrating alternative examples of the heat-absorbing material 314 that may be encapsulated within the heat-shielding microcapsules 302 of FIG. 3.

In the embodiment depicted in FIG. 4A, the heat-absorbing material 314 corresponds to a phase change material. The phase change material may be tailored to undergo a phase change in a desired temperature range (e.g., near a liquidous temperature of 217° C.). An example of a phase change material includes a tin (Sn) alloy, with Sn having a heat of fusion of 7 kJ/mol.

In the embodiment depicted in FIG. 4A, the heat-absorbing material 314 corresponds to a volatile material. The volatile material may vaporize or sublimate in a desired temperature range (e.g., near a liquidous temperature of 217° C. for Sb-tree solder). The vaporization/sublimation reaction is endothermic, thereby absorbing heat to protect a temperature sensitive component during high-temperature PCB processing.

Illustrative, non-limiting examples of volatile materials with corresponding vaporization/sublimation temperatures include phenol (182° C.); iodine (184.3° C.); aniline (184.4° C.); propylene glycol (187° C.); ethylene glycol (197° C.); petroleum (210° C.); nitrobenzene (210.9° C.); and naphthalene (210.9° C.). In the case of ethylene glycol, the heat of vaporization is 65.6 kJ/mol. In the case of propylene glycol, the heat vaporization is 66.5 kJ/mol.

In the embodiment depicted in FIG. 4C, the heat-absorbing material 314 corresponds to an insulative material. Instead of undergoing an endothermic reaction, the insulative material may enable the shielding layer 308 to create an insulative barrier around the TSC 104. Examples of insulative materials may include reaction-cured glass, air or another gas, among other alternatives.

Thus, FIGS. 4A to 4C illustrate alternative embodiments of different materials that may be encapsulated within a heat-shielding microcapsule to protect a temperature sensitive component during high-temperature PCB processing.

Figure 5:
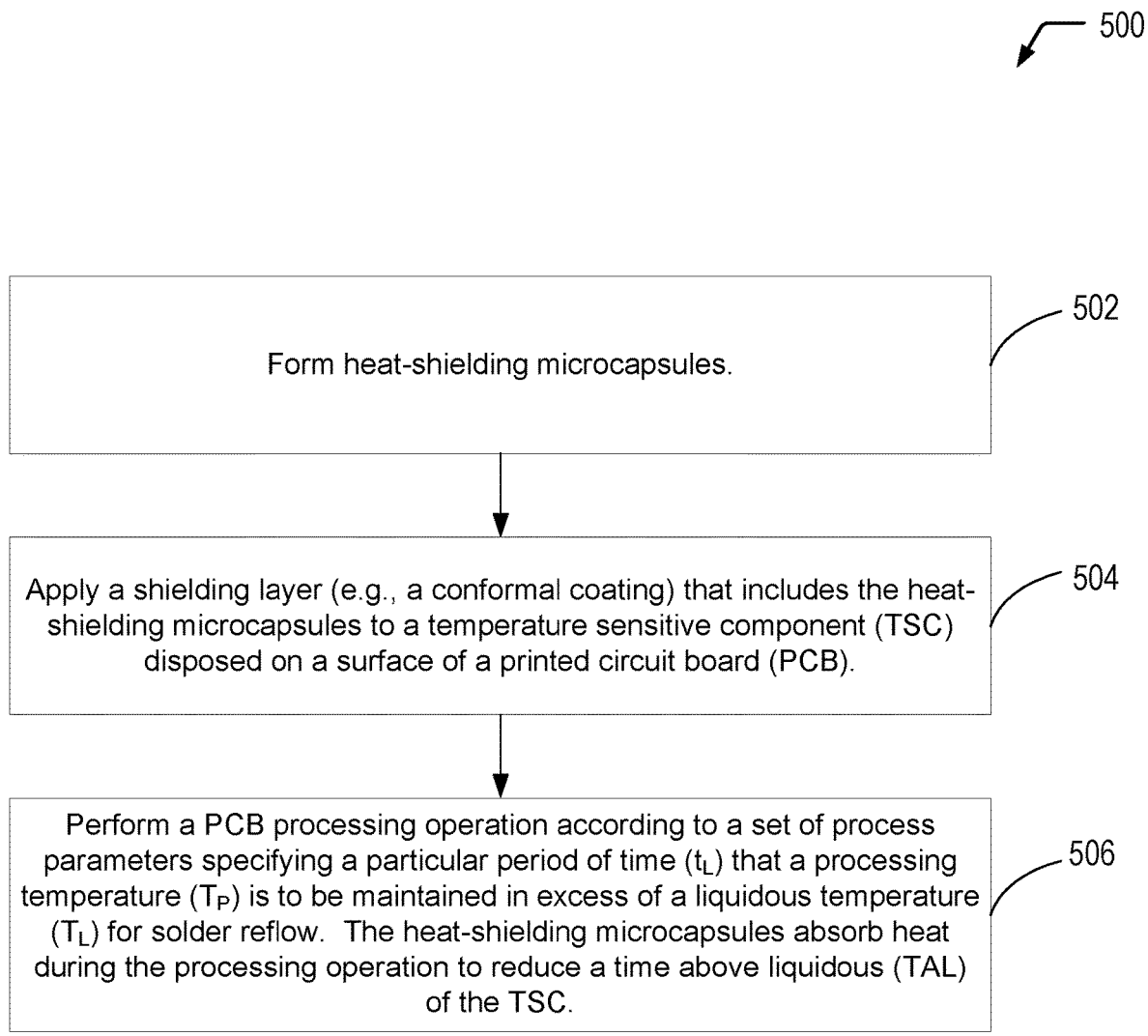
FIG. 5 is a flow diagram depicting a particular embodiment of a process of utilizing heat-shielding microcapsules to protect a temperature sensitive component during printed circuit board processing.

Referring to FIG. 5, a flow diagram illustrates an example of a process 500 of utilizing heat-shielding microcapsules to protect a temperature sensitive component during PCB processing, according to one embodiment. It will be appreciated that the operations shown in FIG. 5 are for illustrative purposes only and that the operations may be performed in alternative orders, at alternative times, by a single entity or by multiple entities, or a combination thereof. For example, one entity may form the heat-shielding microcapsules, while the same entity or a different entity may incorporate the heat-shielding microcapsules into a shielding layer for application to the temperature sensitive component. In some cases, the same entity or a different entity may apply the shielding layer including the heat-shielding microcapsules to the temperature sensitive component prior to performing a high-temperature PCB processing operation.

The process 500 includes forming heat-shielding microcapsules, at 502. As an example, referring to the heat-shielding microcapsules 102 depicted in FIGS. 1 and 2, the capsule wall 116 may be designed to rupture when exposed to a particular temperature, while the outer wall 110 may be formed so as to not rupture when exposed to the particular temperature. Accordingly, the capsule wall 116 may be formed from a first polymeric material having a heat tolerance that is relatively low compared to a second polymeric material that is used to form the outer wall 110. As another example, the heat-shielding microcapsules 302 depicted in FIGS. 3 and 4A-4C may be formed by encapsulating the heat-absorbing material 314 that corresponds to a phase change material (as in FIG. 4A), a volatile material (as in FIG. 4B), or an insulative material (as in FIG. 4C).

The process 500 includes applying a shielding layer to a TSC disposed on a surface of a PCB, at 504. The shielding layer includes the heat-shielding microcapsules. As an example, referring to FIG. 1, the shielding layer 108 including the heat-shielding microcapsules 102 may be applied to the TSC 104 as a conformal coating, or the heat-shielding microcapsules 102 may be incorporated into an adhesive tape that is applied to the TSC 104. As another example, referring to FIG. 3, the shielding layer 308 including the heat-shielding microcapsules 302 may be applied to the TSC 104 as a conformal coating, or the heat-shielding microcapsules 302 may be incorporated into an adhesive tape that is applied to the TSC 104.

The process 500 includes performing a PCB processing operation at a processing temperature that exceeds a liquidous temperature ($T_L$) for solder reflow, at 506. The heat-shielding microcapsules reduce a TAL of the TSC during the PCB processing operation. As an example, when a temperature near the TSC 104 depicted in FIG. 1 reaches a threshold temperature that may pose a risk to the TSC 104, the capsule wall 116 ruptures, and the reactants mix, triggering an endothermic reaction (as depicted in FIG. 2). The endothermic reaction absorbs heat during the processing operation to reduce the TAL of the TSC 104, thereby mitigating latent defect risk and processing limitations. As another example, when a temperature near the TSC 104 depicted in FIG. 3 reaches a threshold temperature that may pose a risk to the TSC 104, the heat-absorbing material 314 may undergo a phase change (see FIG. 4A), may vaporize/sublimate (see FIG. 4B), or may provide an insulative barrier (see FIG. 4C), reducing the TAL of the TSC 104, thereby mitigating latent defect risk and processing limitations.

Thus, FIG. 5 illustrates an example of a process of utilizing heat-shielding microcapsules to protect a temperature sensitive component during high-temperature PCB processing. By absorbing heat in an area on and/or around the temperature sensitive component, the heat-shielding microcapsules may reduce a TAL of the TSC, thereby reducing a likelihood of latent defects in the TSC that may result in subsequent failure of the printed circuit board.

It will be understood from the foregoing description that modifications and changes may be made in various embodiments of the present invention. The descriptions in this specification are for purposes of illustration only and are not to be construed in a limiting sense. The scope of the present invention is limited only by the language of the following claims.

What is claimed is:

1. A process of utilizing heat-shielding microcapsules to protect a temperature sensitive component, the process comprising:
    applying a shielding layer including heat-shielding microcapsules to a temperature sensitive component disposed on a surface of a printed circuit board, wherein the heat-shielding microcapsules include shell-in-shell microcapsules having an inner shell and an outer shell to isolate reactants that undergo an endothermic chemical reaction; and
    performing a processing operation on the printed circuit board according to a set of process parameters specifying a particular period of time ($t_L$) that a processing temperature ($T_P$) is to be maintained in excess of a liquidous temperature ($T_L$) for solder reflow, wherein the heat-shielding microcapsules absorb heat during the processing operation to reduce a time above liquidous (TAL) of the temperature sensitive component.

2. The process of claim 1, wherein the inner shell is formed from a polymeric material having a melt temperature ($T_m$) or a decomposition temperature ($T_d$) that is less than the liquidous temperature ($T_L$) for solder reflow.

3. The process of claim 2, wherein the polymeric material includes one of: a Poly(acrylonitrile) material; a Poly(acrylonitrile)-alpha-propyl material; and a Poly(aminoditrimethylene oxamide)-N-methyl material.

4. The process of claim 3, wherein the outer shell wall is formed from a second polymeric material having a second melt temperature ($T_m$) or a second decomposition temperature ($T_d$) that is greater than the processing temperature ($T_P$).

5. The process of claim 1, wherein the liquidous temperature ($T_L$) is 217° C., and wherein the TAL of the temperature sensitive component is in a range of 60 seconds to 150 seconds.

6. The process of claim 5, wherein the TAL of the temperature sensitive component is less than 60 seconds.

7. The process of claim 1, wherein applying the shielding layer includes applying a conformal coating containing the heat-shielding microcapsules.

8. The process of claim 1, wherein applying the shielding layer includes applying an adhesive tape containing the heat-shielding microcapsules.

9. A process of utilizing heat-shielding microcapsules to protect a temperature sensitive component, the process comprising:
    applying a shielding layer including heat-shielding microcapsules to a temperature sensitive component disposed on a surface of a printed circuit board, the heat-shielding microcapsules encapsulating a heat-absorbing material; and
    performing a processing operation on the printed circuit board according to a set of process parameters specifying a particular period of time ($t_L$) that a processing temperature ($T_P$) is to be maintained in excess of a liquidous temperature ($T_L$) for solder reflow, wherein the heat-shielding microcapsules absorb heat during the processing operation to reduce a time above liquidous (TAL) of the temperature sensitive component.

10. The process of claim 9, wherein the heat-absorbing material is a phase change material.

11. The process of claim 10, wherein the phase change material is a tin (Sn) alloy.

12. The process of claim 9, wherein the heat-absorbing material is a volatile material.

13. The process of claim 12, wherein the volatile material vaporizes or sublimates at a temperature that is less than the liquidous temperature ($T_L$) for solder reflow.

14. The process of claim 9, wherein the heat-absorbing material is an insulative material selected from the group consisting of: a reaction-cured glass material or a gaseous material.

15. The process of claim 9, wherein the liquidous temperature ($T_L$) is 217° C., and wherein the TAL of the temperature sensitive component is in a range of 60 seconds to 150 seconds.

16. The process of claim 15, wherein the TAL of the temperature sensitive component is less than 60 seconds.

17. The process of claim 9, wherein applying the shielding layer includes applying a conformal coating containing the heat-shielding microcapsules.

18. The process of claim 9, wherein applying the shielding layer includes applying an adhesive tape containing the heat-shielding microcapsules.

* * * * *